United States Patent
Nauroy

(10) Patent No.: US 8,604,860 B2
(45) Date of Patent: Dec. 10, 2013

(54) ACTIVE DAMPING CIRCUIT FOR ELECTRIC CHOPPER CIRCUIT

(75) Inventor: Pascal Nauroy, Paris (FR)

(73) Assignee: Sagem Defense Securite, Paris (FR)

( * ) Notice: Subject to any disclaimer, the term of this patent is extended or adjusted under 35 U.S.C. 154(b) by 281 days.

(21) Appl. No.: 13/002,253

(22) PCT Filed: Jun. 30, 2009

(86) PCT No.: PCT/FR2009/000804
§ 371 (c)(1),
(2), (4) Date: Jan. 19, 2011

(87) PCT Pub. No.: WO2010/000979
PCT Pub. Date: Jan. 7, 2010

(65) Prior Publication Data
US 2011/0109282 A1    May 12, 2011

(30) Foreign Application Priority Data

Jul. 3, 2008  (FR) ..................................... 08 03789

(51) Int. Cl.
*H03K 5/00* (2006.01)
*H03K 5/08* (2006.01)

(52) U.S. Cl.
USPC .......................................... 327/310; 327/321

(58) Field of Classification Search
USPC ................... 327/310, 321, 380, 381; 323/908
See application file for complete search history.

(56) References Cited

U.S. PATENT DOCUMENTS

| | | | | |
|---|---|---|---|---|
| 4,363,067 A | * | 12/1982 | Radomski | 361/91.7 |
| 4,438,486 A | * | 3/1984 | Ferraro | 363/56.12 |
| 4,899,270 A | * | 2/1990 | Bond | 363/21.01 |
| 4,937,725 A | | 6/1990 | Dhyanchand | |
| 5,636,114 A | * | 6/1997 | Bhagwat et al. | 363/56.12 |
| 6,630,805 B2 | * | 10/2003 | Makaran | 318/400.26 |
| 7,233,507 B2 | * | 6/2007 | Schenk | 363/50 |
| 8,107,268 B2 | * | 1/2012 | Chung et al. | 363/56.12 |

FOREIGN PATENT DOCUMENTS

| | | |
|---|---|---|
| DE | 100 20 137 A1 | 10/2001 |
| EP | 1 213 826 A | 6/2002 |
| WO | WO 98/34313 A | 8/1998 |

OTHER PUBLICATIONS

Fang et al., "A passive soft-switching snubber for pwm inverters," 33$^{rd}$ Annual IEEE Power Electronics Specialists Conference, PESC 2002, Conference Proceedings, Cairns, Queensland, Australia, Jun. 23-27, 2002, pp. 129-134.

* cited by examiner

*Primary Examiner* — Adolf Berhane
*Assistant Examiner* — Emily P Pham
(74) *Attorney, Agent, or Firm* — Muncy, Geissler, Olds & Lowe, PLLC

(57) ABSTRACT

A snubber circuit for a chopper circuit has at least one chopper transistor with terminals connected to a first line and to a second line, the first line being at a power supply potential and the second line being at ground potential. The snubber circuit has a capacitive element and a charging diode for charging the capacitive element. The charging diode and the capacitive element are connected in series to each other and together they are connected in parallel with the chopper transistor. The snubber circuit has an inductive element having a first end connected to a connection point situated between the charging diode and the capacitive element, and a second end connected to one of the lines.

5 Claims, 2 Drawing Sheets

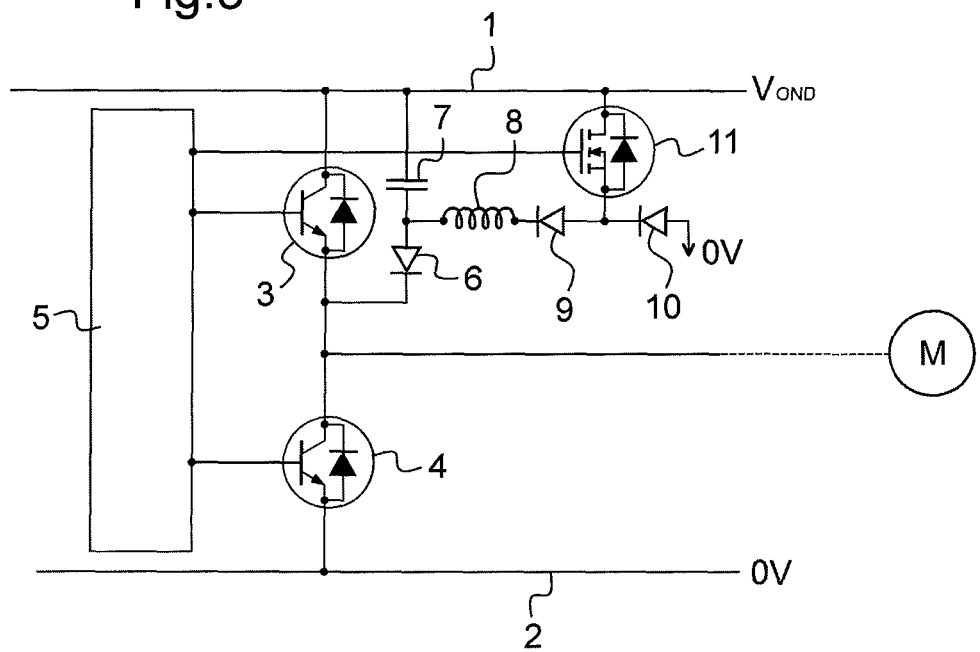
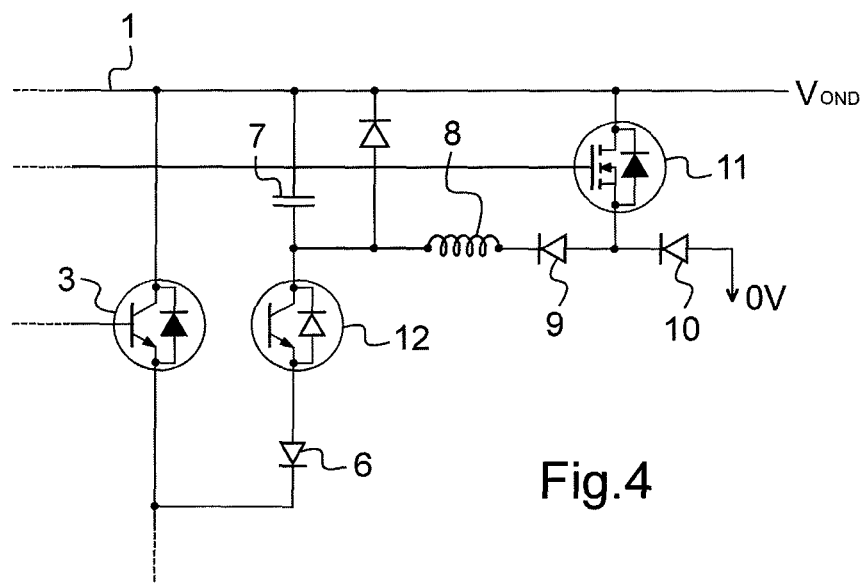

ACTIVE DAMPING CIRCUIT FOR ELECTRIC CHOPPER CIRCUIT

The present invention relates to a snubber circuit for a chopper circuit of the kind used in inverters for electrically powering electronic equipment.

BACKGROUND OF THE INVENTION

An inverter generally comprises a chopper circuit having pairs in chopper transistors that are connected to each other in series. These pairs of chopper transistors are connected in parallel between a first line and to a second line. The first line is at a power supply potential and the second line is at ground potential. Such inverters are subjected to thermal stresses and they are subjected to surge voltages and to fast variations in voltage that stress their components.

In order to remedy those drawbacks, it is known to associate a chopper circuit with a snubber circuit that comprises a capacitive element and a charging diode for charging the capacitive element, which capacitive element and charging diode are connected to each other in series and together they are connected in parallel with one of the chopper transistors in each pair of chopper transistors. The snubber circuit also includes a resistor having a first end connected to a connection point situated between the charging diode and the capacitive element, and a second end connected to the first line. Thus, when the chopper transistor switches from its conductive stage to its non-conductive state, the energy loss resulting from switching is recovered via the diode in the capacitive element that enables a zero voltage to be maintained across the terminals of the transistor. When the chopper transistor is controlled to switch to its conductive state, the energy stored in the capacitive element is dissipated in the resistor. A chopper circuit fitted with such a snubber circuit thus presents poor efficiency.

OBJECT OF THE INVENTION

An object of the invention is to provide means serving to improve the efficiency of chopper circuits that are fitted with snubber circuits.

SUMMARY OF THE INVENTION

To this end, the invention provides a snubber circuit for a chopper circuit having at least one chopper transistor with terminals connected to a first line and to a second line, the first line being at a power supply potential and the second line being at ground potential, the snubber circuit comprising a capacitive element and a charging diode for charging the capacitive element, the charging diode and the capacitive element being connected in series to each other and together they are connected in parallel with the chopper transistor. The snubber circuit comprises an inductive element having a first end connected to a connection point situated between the charging diode and the capacitive element, and a second end connected to one of the lines.

Thus, the energy stored in the capacitive element is re-injected into the first line via the inductive element. This makes it possible to reduce the energy losses caused by switching the chopper transistor into its non-conductive state.

Preferably, the snubber circuit comprises a driver transistor that is connected to the second end of the inductive element and to the other one of the lines, and that possesses a conductive state for charging the inductive element and a non-conductive state for discharging the inductive element.

The driver transistor serves to control the restoration of the recovered energy to the first line.

Advantageously, the driver transistor is controlled to switch from its conductive state to its non-conductive state before the inductive element is fully charged, and preferably, the driver transistor is controlled to switch from its conductive state to its non-conductive state when the voltage across the capacitive element reaches about half of the power supply potential.

By discharging the inductive element before the end of discharging the capacitive element, discharge of the capacitive element is accelerated by an entrainment effect that reduces transfer time, thereby making it possible to increase the chopping frequency. The current flowing through the inductive element is also limited.

Advantageously, a protection transistor is connected in series between the charging diode and the capacitive element.

The protection transistor serves to avoid accidentally passing power from the power supply through the inductive element.

Preferably, a diode is connected in parallel with the capacitive element between the first end of the inductive element and the second line.

This diode serves to avoid recharging the capacitive element with energy coming from the inductive element at the end of energy transfer between the inductive element and the power supply line.

Other characteristics and advantages of the invention appear on reading the following description of a particular, non-limiting embodiment of the invention.

BRIEF DESCRIPTION OF THE DRAWINGS

Reference is made to the accompanying drawings, in which:

FIG. 3 is a view analogous to FIG. 1 of a chopper circuit fitted with a snubber circuit in accordance with a second embodiment of the invention; and FIG. 4 is a view analogous to FIG. 2 of a variant embodiment of the snubber circuit.

DETAILED DESCRIPTION OF THE INVENTION

Figure 1:
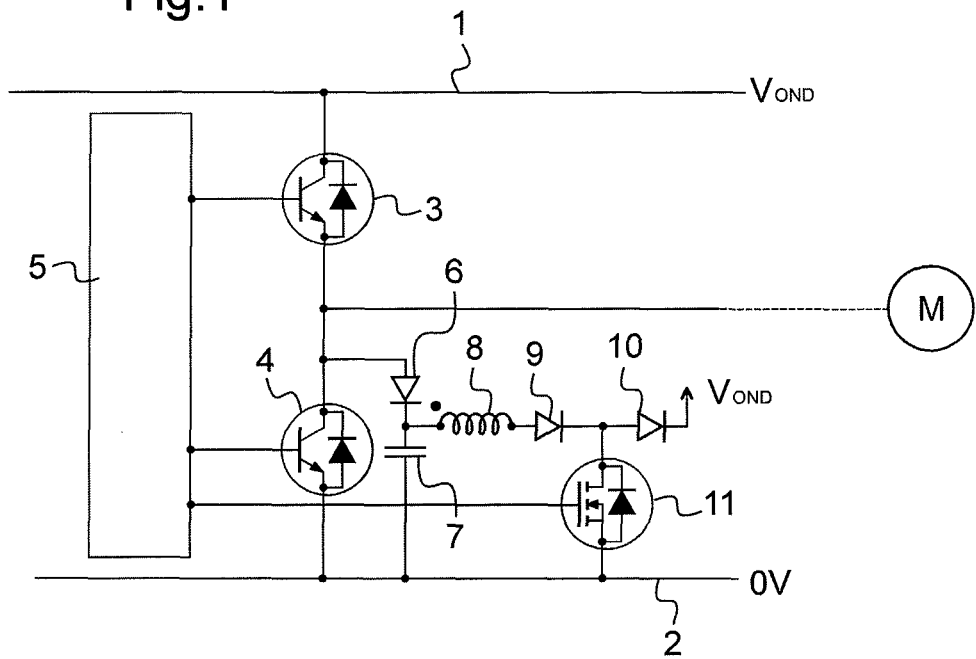
FIG. 1 is a diagrammatic view of a portion of a chopper circuit fitted with a snubber circuit in accordance with a first embodiment of the invention.

With reference to the figure, the invention is described herein in application to an inverter connected in conventional manner to a network for distributing electricity as delivered by an alternator connected to an engine.

The inverter comprises a power supply line 1 at a power supply potential $V_{ond}$ and a ground line 2 (at a potential of 0 volts (V)) with a conventional chopper circuit connected between them.

The chopper circuit comprises pairs of chopper transistors 3, 4 that are connected in series with each other. The pairs of chopper transistors 3, 4 (only one pair being shown herein) are connected in parallel between the power supply line 1 and the ground line 2. The chopper transistors 3, 4 are of the insulated gate bipolar transistor (IGBT) type, and each has a grid connected to a control circuit 5 of the sequencer type.

The chopper circuit is associated with a snubber circuit including a capacitive element 7 connected in series with a charging diode 6 for charging the capacitive element 7. The charging diode 6 and the capacitive element 7 are connected in parallel with the chopper transistor 4. More precisely, the charging diode 6 is connected to the connection point between the chopper transistors 3 and 4, and the capacitive element 7 is itself connected to ground.

The snubber circuit comprises a boost line connected, firstly to the connection point between the charging diode 6 and the capacitive element 7, and secondly to the power supply line 1. The boost line comprises in series an inductive element 8 having a first end connected to the connection point between the capacitive element 7 and the charging diode 6, and a second end connected to a diode 9, itself connected to a diode 10 connected to the power supply line 1.

A driver transistor 11 is connected firstly to the boost line between the diodes 9 and 10, and secondly to the ground line 2 so as to extend in parallel with the capacitive element 7. This driver transistor 11 is a metal oxide on silicon field effect transistor (MOSFET) having its grid connected to the control circuit 5.

The operation of the chopper circuit is itself known and is not described in detail herein.

The capacitive element 7 recovers the energy associated with switching the chopper transistor 4 from its conductive state to its non-conductive state, and it maintains a substantially zero voltage across its terminals at the instant of switching. The capacitive element 7 thus facilitates switching the chopper transistor 4 from its conductive state to its non-conductive state. The charging diode 6 serves to charge the capacitive element 7 unidirectionally.

When the chopper transistor 4 has returned to its conductive state, and the driver transistor 11 is taken to its conductive state, energy is transferred from the capacitive element 7 to the inductive element 8. This transfer of energy serves to initiate current flow through the inductive element 8 so as to trigger boost mode when the driver transistor 11 is taken to its non-conductive state.

If the current flowing through the capacitive element 7 is zero at the moment the driver transistor 11 opens, then energy transfer takes place via the inductive element 8, the charging diode 6, the diode 9, and the diode 10. The current flowing through the inductive element 8 follows a straight-line discharge curve.

If the current flowing through the capacitive element 7 is non-zero at the moment the driver transistor 11 opens, then energy transfer takes place via a resonant system constituted by the capacitive element 7 and the inductive element 8, via the charging diode 6, the diode 9, and the diode 10. The current flowing through the inductive element 8 and the capacitive element 7 follows the tail of a sinewave of period P proportional to the square root of the ratio of the capacitance C of the capacitive element 7 to the inductance L of the inductive element ($P = 2 \cdot \pi \cdot (C/L)^{1/2}$). Preferably, the driver transistor 11 is taken to its non-conductive state when the voltage across the capacitive element 7 reaches about half of the power supply voltage.

The inductive element 8 transfers energy from the capacitive element 7 to the power supply line 1, after the chopper transistor 4 has been switched from its non-conductive state to its conductive state.

The diode 9 prevents current from reversing through the inductive element 8, and thus prevents the capacitive element 7 recharging at the end of energy transfer from the inductive element 8 to the power supply line 1.

Figure 2:
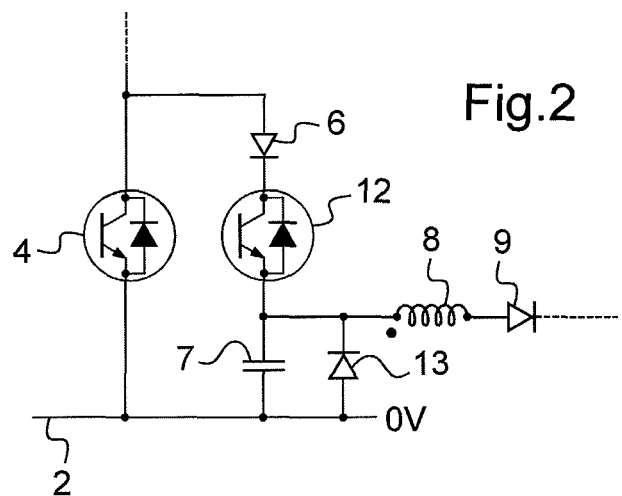
FIG. 2 is a fragmentary view of a variant embodiment of the snubber circuit.

In a variant, as shown in FIG. 2, a protection transistor 12 is connected between the charging diode 6 and the capacitive element 7, and it is controlled by the control circuit 5 to prevent damage to the components of the circuit if the driver transistor 11 is taken to its conductive state while the chopper transistor 4 is in its non-conductive state (energy transfer from the power supply line 1 to the driver transistor 11 passing via the charging diode 6, the inductive element 8, and the diodes 9 and 10).

A diode 13 is connected in parallel with the capacitive element 7 between the first end of the inductive element 8 and the ground line 2.

Elements identical or analogous to those described above are given the same references in FIG. 3, showing a second embodiment.

In this embodiment, the snubber circuit is connected to the power supply line 1 and is connected in parallel with the chopper transistor 3 instead of being connected to the ground line 2 and in parallel with the chopper transistor 4, as shown in FIG. 1.

The snubber circuit comprises a capacitive element 7 connected in series with a charging diode 6 for charging the capacitive element 7. The charging diode 6 and the capacitive element 7 are connected in parallel with the chopper transistor 3. More precisely, the charging diode 6 is connected to the connection point between the chopper transistors 3 and 4, and the capacitive element 7 is connected to the power supply line 1.

The snubber circuit comprises a boost line connected firstly to the connection point between the charging diode 6 and the capacitive element 7, and secondly to the ground line 2. The boost line comprises in series an inductive element 8 having a first end connected to the connection point between the capacitive element 7 and the charging diode 6, and a second end connected to a diode 9, itself connected to a diode 10 connected to the ground line 2.

A driver transistor 11 is connected firstly to the boost line between the diodes 9 and 10, and secondly to the power supply line 1 in order to extend in parallel with the capacitive element 7.

In a variant of the second embodiment, as shown in FIG. 4, a protection transistor 12 is connected between the charging diode 6 and the capacitive element 7, and it is controlled by the control circuit 5 to prevent damage to the components of the circuit if the driver transistor 11 is taken to its conductive state while the chopper transistor 3 is in its non-conductive state (energy transfer from the power supply line 1 to the driver transistor 11 passing via the charging diode 6, the inductive element 8, and the diodes 9 and 10).

A diode 13 is connected in parallel with the capacitive element 7 between the first end of the inductive element 8 and the power supply line 1.

Naturally, the invention is not limited to the above-described embodiment and variants may be applied thereto without going beyond the ambit of the invention as defined by the claims.

In particular, the snubber circuit may have a structure that is different from that described, and in particular it need not have a driver transistor or diodes. If the inverter is connected to a source of three-phase alternating current (AC), it has three pairs of transistors, or two pairs of transistors if it is connected to a two-phase source of AC (only one pair of transistors being shown herein for greater clarity of the diagrams).

The transistors 11 and 12, and the diodes 9, 10, and 13 are optional.

What is claimed is:

1. A snubber circuit for a chopper circuit having at least one chopper transistor with terminals connected to a first line and to a second line, the first line being at a power supply potential and the second line being at ground potential, the snubber circuit comprising:

a capacitive element;

a charging diode for charging the capacitive element;

the charging diode and the capacitive element being connected in series to each other and together they are connected in parallel with the chopper transistor;

an inductive element having a first end connected to a connection point situated between the charging diode and the capacitive element, and a second end connected to one of the lines; and a protection transistor connected in series between the charging diode and the capacitive element.

2. The snubber circuit according to claim 1, comprising a driver transistor that is connected to the second end of the inductive element and to the other one of the lines, and that possesses a conductive state for charging the inductive element and a non-conductive state for discharging the inductive element.

3. The snubber circuit according to claim 2, wherein the driver transistor is controlled to switch from its conductive state to its non-conductive state before the inductive element is fully charged.

4. The snubber circuit according to claim 3, wherein the driver transistor is controlled to switch from its conductive state to its non-conductive state when the voltage across the capacitive element reaches about half of the power supply potential.

5. The snubber circuit according to claim 1, wherein a diode is connected in parallel with the capacitive element between the first end of the inductive element and the second line.

* * * * *